United States Patent
Quiquempoix et al.

(10) Patent No.: US 8,339,299 B2
(45) Date of Patent: Dec. 25, 2012

(54) 2-PHASE GAIN CALIBRATION AND SCALING SCHEME FOR SWITCHED CAPACITOR SIGMA-DELTA MODULATOR USING A CHOPPER VOLTAGE REFERENCE

(75) Inventors: Vincent Quiquempoix, Divonne les Bains (FR); Yann Johner, Preverenges (CH); Gabriele Bellini, Froideville (CH)

(73) Assignee: Microchip Technology Incorporated, Chandler, AZ (US)

(*) Notice: Subject to any disclaimer, the term of this patent is extended or adjusted under 35 U.S.C. 154(b) by 135 days.

(21) Appl. No.: 13/004,127

(22) Filed: Jan. 11, 2011

(65) Prior Publication Data

US 2011/0163901 A1 Jul. 7, 2011

Related U.S. Application Data

(63) Continuation-in-part of application No. 12/832,599, filed on Jul. 8, 2010, now Pat. No. 8,223,053.

(60) Provisional application No. 61/226,049, filed on Jul. 16, 2009.

(51) Int. Cl.
*H03M 3/00* (2006.01)
(52) U.S. Cl. ......... 341/143; 341/144; 341/150; 341/172
(58) Field of Classification Search .................. 341/118, 341/120, 143, 144, 150, 155, 172
See application file for complete search history.

(56) References Cited

U.S. PATENT DOCUMENTS

| | | | | |
|---|---|---|---|---|
| 5,406,283 | A | 4/1995 | Leung | 341/143 |
| 5,995,035 | A * | 11/1999 | Signell et al. | 341/163 |
| 6,788,131 | B1 | 9/2004 | Huang | 327/539 |
| 6,842,486 | B2 * | 1/2005 | Plisch et al. | 375/247 |
| 6,927,723 | B2 * | 8/2005 | Nomasaki et al. | 341/172 |
| 7,102,558 | B2 | 9/2006 | Deval | 341/150 |
| 7,345,615 | B2 * | 3/2008 | Kawahito | 341/162 |

(Continued)

FOREIGN PATENT DOCUMENTS

WO 2005/096505 A1 10/2005

(Continued)

OTHER PUBLICATIONS

Quiquempoix, V., et al.; "A Low-Power 22-bit Incremental ADC", IEEE Journal of Solid-State Circuits, vol. 41, No. 7, pp. 1562-1571, Jul. 2006.

(Continued)

*Primary Examiner* — Linh Nguyen
(74) *Attorney, Agent, or Firm* — King & Spalding L.L.P.

(57) ABSTRACT

A sigma-delta modulator has a chopper voltage reference providing a reference signal having a clock dependent offset voltage, a single-bit or a multi-bit digital-to-analog converter (DAC); a plurality of capacitor pairs; a plurality of switches to couple any capacitor pair to an input or reference signal; and a control unit controlling sampling through said switches to perform a charge transfer in two phases wherein any capacitor pair can be selected to be assigned to the input or reference signal, wherein after a plurality of charge transfers a gain error cancellation is performed by rotating the capacitor pairs cyclically, and wherein a DAC output value and a reference offset state define switching sequences wherein each switching sequence independently rotates said capacitor pairs and wherein at least one switching sequence is selected depending on a current DAC output value and a current reference offset state.

26 Claims, 14 Drawing Sheets

U.S. PATENT DOCUMENTS

| | | | | |
|---|---|---|---|---|
| 7,538,705 | B2 * | 5/2009 | Deval et al. | 341/143 |
| 7,773,023 | B2 * | 8/2010 | Dosho et al. | 341/163 |
| 7,830,293 | B2 * | 11/2010 | Karavidas et al. | 341/161 |
| 8,149,150 | B2 * | 4/2012 | Kawahito | 341/126 |
| 8,223,056 | B2 * | 7/2012 | Dura et al. | 341/150 |
| 8,223,058 | B2 * | 7/2012 | Kobayashi et al. | 341/172 |
| 2005/0219111 | A1 * | 10/2005 | Kobayashi et al. | 341/172 |
| 2010/0103014 | A1 | 4/2010 | Quiquempoix et al. | 341/143 |

FOREIGN PATENT DOCUMENTS

| | | |
|---|---|---|
| WO | 2008/014246 A1 | 1/2008 |

OTHER PUBLICATIONS

Chen, F., et al.; "A High Resolution Multibit Sigma-Delta Modulator with Individual Level Averaging", IEICE Transactions on Electronics, No. 6, pp. 701-707, Jun. 1995.

International PCT Search Report and Written Opinion, PCT/US2010/042096, 16 pages, mailed Jan. 11, 2011.

International PCT Search Report and Written Opinion, PCT/US2011/020789, 16 pages, Mailed Sep. 23, 2011.

* cited by examiner

Reset State

Switches 220 ─────────── "0"

Switches 230 ─────────── "0"

Switches 105 ─────────── "1"

Switches 109 ─────────── "0"

Switches 240 ─────────── "0"

Switches 250 ─────────── "0"

Switch 260 ─────────── "1"

Switches 210 ─────────── "1"

Switches 107/108 ─────────── "1"

Switches 106 ─────────── "0"

FIGURE 5a

**Transfer Zero Charge C*0** sampling | transferring

Switches 220 ─────────── "0"

Switches 230 ───────────

Switches 105 ⎾"1"⎿────────

Switches 109 ──────⎾⎿──

Switches 240 ───────────

Switches 250 ───────────

Switch 260 ─────⎿⎾───

Switches 210 ───────────

Switches 107/108 ═══════════

Switches 106 ───────────

FIGURE 5b

**Transfer C*V_IN** sampling | "1" transferring

Switches 220 ─────⎿─── "0"

Switches 230 ───────────

Switches 105 ⎾⎿────────

Switches 109 ──────⎾⎿──

Switches 240 ───────────

Switches 250 ───────────

Switch 260 ──────⎾───

Switches 210 ───────────

Switches 107/108 ═══════════

Switches 106 ───────────

FIGURE 5c

**Transfer 2*C*V_IN** sampling | transferring

Switches 220 ─────⎿─── "0"

Switches 230 ─────⎾───

Switches 105 ⎾⎿────────

Switches 109 ──────⎾⎿──

Switches 240 ───────────

Switches 250 ───────────

Switch 260 ───────────

Switches 210 ───────────

Switches 107/108 ═══════════

Switches 106 ───────────

FIGURE 5d a) 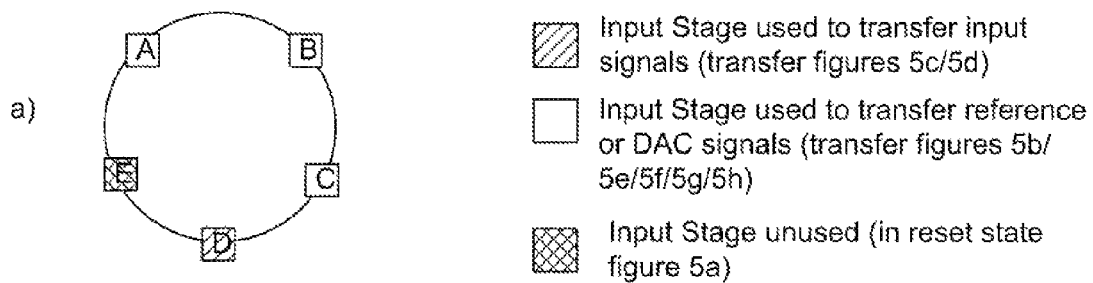
Examples of configuration at a given sample number
b) 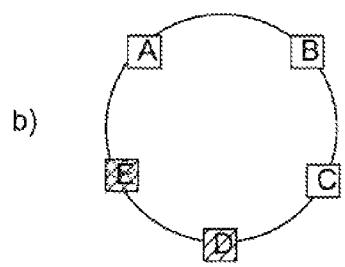
c) 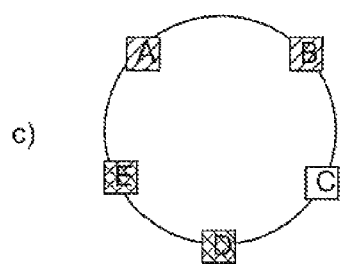
*Figure 6*

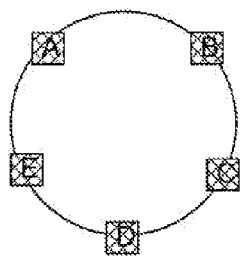

Sample No. 0 : Reset State

DAC Independent algorithm : Rotates at every sample

| Sample No. | Input Signal Stages | Reference Stages |
|---|---|---|
| 0 | - | - |
| 1 | A B | C D E |
| 2 | B C | D E A |
| 3 | C D | E A B |
| 4 | D E | A B C |
| 5 | E A | B C D |
| 6 | A B | C D E |

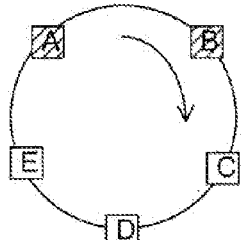

Sample No. 1 : A and B are transferring from input signal, C,D and E are transferring from the reference, gain scaling is 2/3

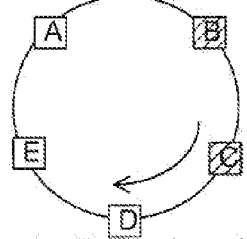

Sample No. 2 : Sample No. 1 : B and C are transferring from input signal, A, D and E are transferring from the reference, gain scaling is 2/3

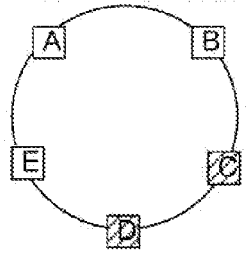

Sample No. 3

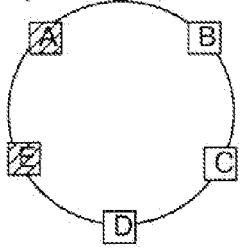

Sample No. 5

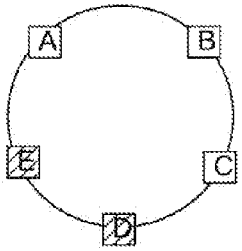

Sample No. 4

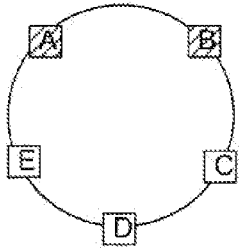

Sample No. 6

*Figure 7*

DAC input dependent algorithm :

Example with N=5, gain scaling=2/3 and a 1-bit DAC
with the following bitstream : 100010

| Sample No. | DAC Level | Input Signal Stages | Reference Stages |
|---|---|---|---|
| 0 | - | - | - |
| 1 | 1 | A B | C D E |
| 2 | 0 | A B | C D E |
| 3 | 0 | B C | D E A |
| 4 | 0 | C D | E A B |
| 5 | 1 | B C | D E A |
| 6 | 0 | D E | A B C |

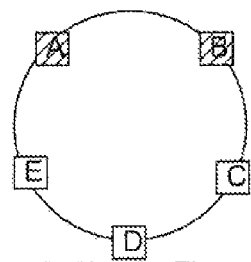

Sample No. 1 : First sample with DAC input=1, takes first rotation algorithm state.

Cycles in this rotation sequence only if DAC input state=1

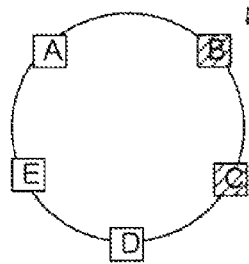

Sample No. 5 : Second Sample with DAC input=1, takes second rotation algorithm state. A memory remembers the last state that was taken with DAC input=1 and restarts the cycle from this state

*Figure 8a*

Example with N=5, gain scaling=2/3 and a 1-bit DAC
with the following bitstream : 100010

| Sample No. | DAC Level | Input Signal Stages | Reference Stages |
|---|---|---|---|
| 0 | - | - | - |
| 1 | 1 | A B | C D E |
| 2 | 0 | A B | C D E |
| 3 | 0 | B C | D E A |
| 4 | 0 | C D | E A B |
| 5 | 1 | B C | D E A |
| 6 | 0 | D E | A B C |

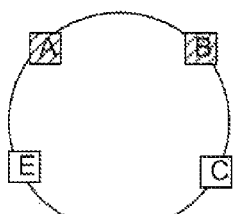

Sample No. 2 : First sample with DAC input=0, takes first rotation algorithm state.

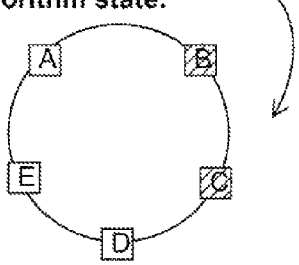

Cycles in this rotation sequence only if DAC input state=0

Sample No. 3 : Second Sample with DAC input=0, takes second rotation algorithm state

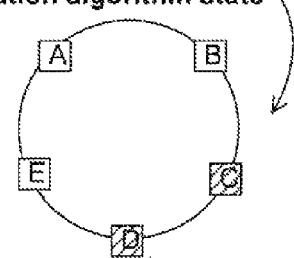

Cycles in this rotation sequence only if DAC input state=0

Sample No. 4 : Third Sample with DAC input=0, takes third rotation algorithm state

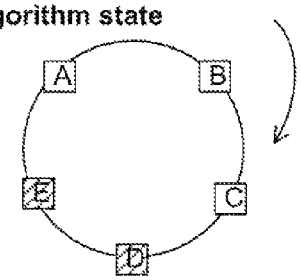

Cycles in this rotation sequence only if DAC input state=0

*Figure 8b*

Sample No. 6 : Fourth Sample with DAC input=0, takes fourth rotation algorithm state … # 2-PHASE GAIN CALIBRATION AND SCALING SCHEME FOR SWITCHED CAPACITOR SIGMA-DELTA MODULATOR USING A CHOPPER VOLTAGE REFERENCE

CROSS-REFERENCE TO RELATED APPLICATIONS

This application is a continuation-in-part of U.S. patent application Ser. No. 12/832,599 filed on Jul. 8, 2010 now U.S. Pat. No. 8,223,053, which claims the benefit of U.S. Provisional Application No. 61/226,049 filed on Jul. 16, 2009, the contents of which are hereby incorporated by reference in their entirety.

TECHNICAL FIELD

The present disclosure relates to analog-to-digital converters, in particular to sigma-delta modulators and, more particularly, to a way of reducing the gain error due to influence of mismatched capacitors in sigma-delta modulators, with no penalty on the conversion time.

BACKGROUND

Analog-to-digital converters (ADC) are in widespread use today in electronics for consumers, industrial applications, etc. Typically, analog-to-digital converters include circuitry for receiving an analog input signal and outputting a digital value proportional to the analog input signal. This digital output value is typically in the form of either a parallel word or a serial digital bit string. There are many types of analog-to-digital conversion schemes such as voltage to-frequency conversion, charge redistribution, delta modulation, as well as others. Typically, each of these conversion schemes has its advantages and disadvantages. One type of analog-to-digital converter that has seen increasing use is the switched capacitor sigma-delta converter.

FIG. 1A shows the principle block diagram of a sigma-delta ADC. A loop filter 10 receives the analog input value and is connected to a quantizer 20. The quantizer can generate a single bit output or in other embodiments is operable to generate multiple distinct output levels that can be encoded in an n-bits bit steam. This single bit output or n bits bit stream is fed back to a DAC 30 which generates an output signal that is fed to the loop filter 10. In a sigma-delta analog-to-digital converter (ADC), the bitstream (1-bit or multi-bit) is then usually processed by a digital decimation filter to produce a decimated higher resolution digital word that represents the input signal.

The stable input range of any high order sigma-delta modulator used in a sigma-delta converter is limited to a fraction of the reference voltage. Outside of this stable input range the error becomes very large and the modulator gives erroneous results. Therefore, the signal must be attenuated to stay in this stable input range (S/R<1), where S is the signal voltage and R is the reference voltage. The minimal attenuation depends on the modulator order and on the number of levels in the DAC, it is typically a larger attenuation with a larger modulator order and with a lower number of DAC levels. In order to achieve a final gain of 1, the signal attenuation can be compensated in the digital section. FIG. 1B shows an example of the distribution of quantization noise depending on the normalized differential input value for a $3^{rd}$ order 1-bit sigma-delta modulator. Here the input signal must be attenuated to ⅔ of the nominal value to ensure low noise. Above this range the modulator becomes unstable.

The input and DAC voltage are sampled on capacitors (or pairs of capacitors for differential voltages) inside the loop filter of the delta-sigma modulator. However, if these voltages are sampled on different capacitors, the mismatch error of the capacitors will produce a gain error on the output result of the sigma-delta ADC. In order to prevent this mismatch, one of the solutions is to sample the signal and the DAC voltages on the same capacitors, this way there is no mismatch error and the gain error is cancelled. However since there is a need of scaling the inputs with a S/R<1 ratio, the capacitors for the signal and the DAC voltages have to be different in size. The other drawback of this technique is that you cannot sample two voltages on one capacitors, so the sampling of the input signal and DAC voltage have to be done one after the other resulting in a 4-phase system: 2 phases to sample and transfer charges coming from the input signals, and then 2 phases to sample and transfer charges coming from DAC voltage. This 4-phase system is less efficient because the sampling is done in series and consumes more time than if the DAC voltage and input voltage sampling were done in parallel.

Today's state of the art in sigma-delta modulators for achieving a low part-per-million (ppm) level gain error and reduce impact of the mismatch of the capacitors used to sample DAC and input signal voltages, the sampling capacitors are divided into R groups of same size capacitors. At each sample, a number of capacitors groups S, with S≦R is used to sample and transfer the input signal voltage during the first two phases. At the same time, R-S groups of capacitors are sampling a common mode voltage signal (or ground for a single-ended circuit), which contribution to the total charge transferred is zero. All R groups of capacitors are used to sample and transfer the DAC voltage during the last two phases. The S/R ratio is well achieved here by using this technique. In order to minimize the mismatch effects, the S groups of capacitors are chosen among the R groups differently at each sample with a certain sequence so that all the R groups of capacitors have sampled the same amount of times the input signal after a certain period of time. This sequence is rotating the input capacitors (the ones that sample the input voltage) in order to average the mismatch errors and this technique can diminish drastically the gain error down to the low ppm levels if the average is done for a certain amount of samples.

However requiring four steps (phases) per sample limits the sample rate of the sigma-delta modulator, and/or requires much faster operating speed (faster clocking and higher frequency operation components with a subsequence increase in power usage) of the sigma-delta modulator to complete a signal conversion in a desired time frame. Therefore what is needed is a sigma-delta modulator that has faster sampling rates that could use only two phases instead of four with less power consumption while maintaining a very low gain error (2 phases is the minimum number one can achieve because there is a need for a sampling and a transfer of the charge at the inputs).

SUMMARY

According to an embodiment, a sigma-delta modulator may comprise a chopper voltage reference providing a reference signal having a clock dependent offset voltage, a single-bit or a multi-bit digital-to-analog converter (DAC); a plurality of capacitor pairs; a plurality of switches to couple any pair of capacitors from said plurality of capacitor pairs selectively to an input signal or the reference signal; and control means operable to control sampling through said switches to perform a charge transfer in two phases wherein any pair of capacitors can be selected to be assigned to the input signal or the reference signal, wherein after a plurality of charge transfers a gain error cancellation is performed by rotating the capacitor pairs cyclically such that after a rotation cycle, each capacitor pair has been assigned a first predetermined number of times to the input signal, and has also been assigned a second predetermined number of times to the reference signal, and wherein an output value of the DAC and an offset state of said chopper voltage reference define a plurality of switching sequences wherein each switching sequence independently rotates said capacitor pairs and wherein at least one switching sequence is selected depending on a current output value of the DAC and a current offset state of the chopper voltage reference.

According to a further embodiment, a switching sequence can be selected from all possible switching sequences depending on a current output value of the DAC and a current offset state of the chopper voltage reference. According to a further embodiment, for a first sub-set of DAC output values a switching sequence can be selected depending only on a current output value of the DAC and for a remaining sub-set of DAC output values, a switching sequence can be selected depending on a current output value of the DAC and a current offset state of the chopper voltage reference. According to a further embodiment, in a five-level DAC, the first sub-set may include even output values and the remaining sub-set may include odd output values. According to a further embodiment, the sigma-delta modulator may further comprise switches to selectively couple a common mode voltage to a selected pair of capacitors. According to a further embodiment, the sigma-delta modulator may comprise a plurality of input stages, each stage comprising a capacitor pair associated switches and receiving said input signal, said reference signal, and said common mode voltage. According to a further embodiment, the reference signal may be provided by a digital-to-analog converter comprising a bandgap chopper voltage reference. According to a further embodiment, the reference signal may be provided by a chopper voltage reference source and each input stage comprises a digital-to-analog converter controlled by the control means. According to a further embodiment, for a charge transfer, during a charge phase, an input signal or reference signal can be coupled on one side of a pair of capacitors and the common ground potential is coupled on the other side of said pair of capacitors and during a transfer phase, the one side of the pair of capacitors are connected with each other or coupled with an inverted input or reference signal. According to a further embodiment, for a zero charge, during a charge phase one side of the pair of capacitors can be connected with each other and the common ground potential is coupled on the other side of said pair of capacitors, and during a transfer phase, the one side of the pair of capacitors are again connected with each other. According to a further embodiment, the sigma-delta modulator may comprise more than two pairs of capacitors wherein a gain is achieved by a ratio of the number of capacitor pairs assigned to the input signal and the number of pairs assigned to the reference signal. According to a further embodiment, the sigma-delta modulator may comprise a differential operation amplifier coupled with outputs of the input stages through a controllable switching network. According to a further embodiment, the sigma-delta modulator may comprise first and second feedback capacitors which can be switched selectively into a negative or positive feedback loop of said differential amplifier. According to a further embodiment, the chopper voltage reference can be clocked by a clock controlling said two phases.

According to another embodiment, a method of performing a charge transfer in a sigma-delta modulator using a plurality of capacitor pairs, may comprise: Generating a reference signal having a clock dependent offset voltage by a chopper voltage reference; Generating a digital-to-analog converter (DAC) output value by a single-bit or a multi-bit DAC; Providing at least two capacitor pairs to be assigned to an input signal and a reference signal; Performing a sampling by combining a sampling of the input signal with at least one capacitor pair and in parallel a sampling of the reference signal with at least another one capacitor pair, wherein sampling is performed in two phases; Rotating the capacitor pairs for a following sampling such that after a plurality of samplings a gain error cancellation is performed wherein after a rotation cycle, each capacitor pair has been assigned a first predetermined number of times to the input signal, and has also been assigned a second predetermined number of times to the reference signal, wherein an output value of the DAC and an offset state of said chopper voltage reference define a plurality of switching sequences wherein each switching sequence independently rotates said capacitor pairs and wherein at least one switching sequence is selected depending on a current output value of the DAC and a current offset state of the chopper voltage reference.

According to a further embodiment of the method, a switching sequence may be selected from all possible switching sequences depending on a current output value of the DAC and a current offset state of the chopper voltage reference. According to a further embodiment of the method, for a first sub-set of DAC output values a switching sequence can be selected depending only on a current output value of the DAC and for a remaining sub-set of DAC output values, a switching sequence can be selected depending on a current output value of the DAC and a current offset state of the chopper voltage reference. According to a further embodiment of the method, in a five-level DAC, the first sub-set may include even output values and the remaining sub-set may include odd output values. According to a further embodiment of the method, during a first sample, a first capacitor pair can be used for sampling an input signal in a charge phase and transfer phase and the second capacitor pair for sampling a reference signal in a charge phase and transfer phase in parallel with said input signal; During a following sample, using the second capacitor pair for sampling an input signal in a charge phase and transfer phase and the first capacitor pair for sampling a reference signal in a charge phase and transfer phase in parallel with said input signal. According to a further embodiment of the method, the method may further comprise coupling each pair of capacitors with one of: a positive input signal line, a negative input signal line, a positive reference signal line, a negative reference signal line, and a common ground potential. According to a further embodiment of the method, for a charge transfer, during a charge phase, the input signal or reference signal can be connected on one side of a pair of capacitors which is otherwise coupled with a common ground potential, and during a transfer phase, connecting the one side of the pair of capacitors with each other or coupling the one side with an inverted input or reference signal. According to a further embodiment of the method, for a zero charge transfer the method may comprise, during a charge phase, connecting one side of a pair of capacitors with each other and connecting the common ground potential on the other side of said pair of capacitors, and during a transfer phase, connecting the one side of the pair of capacitors again with each other. According to a further embodiment of the method, more than two capacitor pairs can be provided, the method may comprise the steps of: During a first sample, selecting a first subset of capacitor pairs from a plurality of capacitor pairs for sampling an input signal in a charge phase and transfer phase and selecting a second subset from the remaining capacitor pairs of said plurality of capacitor pair for sampling a reference signal in a charge phase and transfer phase in parallel with said input signal; Repeating said steps for following samplings, wherein another first and second subset of capacitor pairs is selected that is different from a previously selected first and second subset. According to a further embodiment of the method, the first subset may comprise a plurality of capacitor pairs and the second subset may comprise the remaining capacitor pairs from said more than two capacitor pairs. According to a further embodiment of the method, a gain can be achieved by a ratio of the number of capacitor pairs assigned to the input signal and the number of pairs assigned to the reference signal. According to a further embodiment of the method, the chopper voltage reference can be clocked by a clock controlling said two phases.

BRIEF DESCRIPTION OF THE DRAWINGS

FIGS. 5a-h show the different timing diagrams for the switch commands that correspond to each possible charge transfer at the input stage in the 2-phase algorithm that performs gain scaling and gain error cancellation;

FIG. 6 show a cyclical representation of the state of the input switching stages, with different examples of the possible states for each stage (in this representation the number of input stages is limited to 5);

FIG. 7 shows an example of a rotation algorithm to perform the 2-phase gain scaling and gain error cancellation which is not depending on the DAC input states;

FIGS. 8a and b show another example of a rotation algorithm to perform the 2-phase gain scaling and gain error cancellation, but which is depending on the DAC input states;

DETAILED DESCRIPTION

Figure 1A:
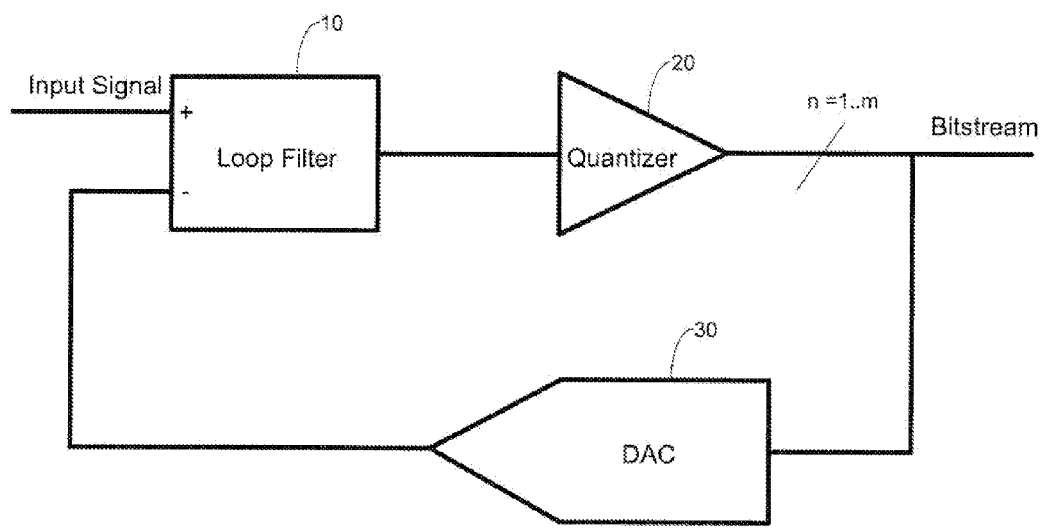
FIG. 1A shows a general block diagram of a sigma-delta analog-to-digital converter.

According to various embodiments, a sigma-delta modulator that can use only two phases instead of four per each sample with less power consumption (due to less stringent requirements on the bandwidth of the amplifiers present in the modulator) while maintaining a very low gain error in the ppm range is achievable by sampling the DAC signals and the input signals at the same time in parallel on different sets of capacitors in the front-end stage of the modulator and by rotating these capacitors at each sample using a defined algorithm in order to average mismatch errors.

Sampling the DAC signals and the input signals at the same time in parallel enables the reduction from four phases to two phases and the rotation algorithm ensures the proper gain error cancellation after a certain number of samples through integration in the modulator loop.

According to the teachings of this disclosure, rotating the capacitors at each sample means assigning different sets of capacitors to transfer charges coming from different input signals (ADC input, DAC output or common-mode voltage) and changing this assignment between each sample after the charges have been completely transferred.

According to the teaching of this disclosure, in order to perform a scaling factor on the form S/R, the input stage sampling capacitors have to be split into N unit size capacitors so that at each sample, a group of S unit size capacitors will be selected to transfer charges from the input signal, a group of R unit size capacitors will be selected to transfer charges from the DAC, and the rest of the capacitors if the total number of unit capacitors N is superior to R+S will be selected to transfer charges from the common-mode signal, and then will not bring any contribution to the total charge transferred and integrated in the front-end stage.

According to the teaching of this disclosure, the rotation of the assignment of the elementary capacitors can follow any algorithm that leads to respecting the scaling factor S/R at any sample (always S capacitors assigned for the input and R capacitors assigned for the DAC) and that ensures that the ratio of the number of assignments to the input divided by the number of assignment to the DAC tends to S/R on each capacitor after a certain number of samples.

The purpose of this rotation, according to the teachings of this disclosure, is to achieve an accurate S/R gain in the modulator and to overcome the mismatch errors inherent to the analog process between the unit size capacitors. Without the rotation of the capacitor pairs between each cycle, the accuracy of the S/R ratio would be limited to a typical value of about 0.1 percent. In contrast, by rotating the capacitors, a conversion can reach a ppm level of accuracy even with a simple rotation algorithm provided each of the sampling capacitors are assigned in average S/R times more to the input signal than to the DAC.

A simple rotation algorithm for achieving an accurate S/R ratio can be done in R+S samples, where at each sample S capacitors are assigned to the input signal and R capacitors are assigned to the DAC signal. If the capacitors are named $C_1, C_2 \ldots C_{R+S}$, the S capacitors chosen for the input signal assignment can simply be the $C_1 \ldots C_S$ capacitors for the first sample, the rest of them being assigned to the DAC. At the second sample, the capacitors $C_2 \ldots C_{S+1}$ will be assigned to the input and $C_{S+2} \ldots C_{R+S}$ and $C_1$ will be assigned to the DAC and so on. At the R+S sample, $C_{R+S}$ and $C_1 \ldots C_{S-1}$ are assigned to the input and $C_S \ldots C_{R+S-1}$ are assigned to the DAC. In total each capacitor has seen S times an assignment of the input and R times an assignment of the DAC during the R+S samples time period, which induces a scaling factor of S/R between the input and the DAC charge transfers.

If the input is considered stable during the rotation algorithm (the input signal bandwidth is considered much lower than the sample frequency, which is usually the case in a sigma-delta ADC) the gain scaling induced by these R+S periods is then S/R even if the capacitors have mismatch errors between them because each capacitor verifies the S/R ratio between the input and the DAC assignment.

However if the DAC does not take the same inputs during the rotation algorithm (i.e. the bitstream is not constant in the sigma-delta modulator), a non-linearity error can be induced since the charge transferred is also depending on the DAC input at each sample, and since the bitstream and the DAC capacitor assignment algorithm are not correlated. In order to overcome this issue, according to various embodiments, a DAC dependent algorithm can be used so that the rotation algorithm ensures that the S/R ratio is achieved on the capacitors assignments on each capacitor for each DAC input value. This leads to longer rotation algorithm and multiplies the number of possible states by the number of possible DAC levels but corrects any non-linearity impact.

For an optimal gain error cancellation, according to various embodiments, each rotation algorithm that leads to an S/R ratio in the capacitors assignment between the input and the DAC should be completed within the number of samples allowed for the analog-to-digital conversion. However this condition can rarely be attained due to a fixed number of samples per conversion and a rotation that can be bitstream dependent and leading to and ideal number of samples taken being a multiple of S+R. In the majority of the cases, the ratio between the number of samples per conversion (oversampling ratio: OSR) and the number of samples to complete the rotation and fully cancel the gain error (typically R+S) is not integer and leads to a residue in the gain error, this residue being small as long as this ratio is large. In this case, the gain error is still reduced by a large factor but not totally cancelled, the gain error reduction tending to be larger as the OSR gets larger.

Using only two phases per conversion instead of four, doubles the throughput rate of the modulator or requires half of the unity-gain bandwidth for amplifiers in the modulator, thus reducing operating power requirements. Heretofore, a two phase conversion cycle using the same set of capacitors for the signal and reference was restricted to single ended modulators for which the signal and reference share the same ground or a differential modulator for which the signal and reference have exactly the same common mode. The single ended solution is generally known to suffer from poor power supply rejection and is no longer used. Moreover, the two phase conversion cycle solution is limited to unipolar voltages unless sufficiently accurate $+V_{REF}$ and $-V_{REF}$ voltages are provided. However, applications where signal and reference voltages having exactly the same common mode voltage are rare. Therefore a conventional two phase conversion cycle using the same set of capacitors for the signal and reference results in very marginal performance.

According to the teachings of this disclosure, the gain error cancellation algorithm described here takes place within each conversion and does not need additional sampling time or additional conversion to be performed. Compared to a simple digital calibration that cancels the gain error for a given set of external conditions (temperature, power supply voltage . . . ), but that needs to be performed again when the conditions vary, this technique allows the gain error to be cancelled continuously as the conditions are changing since the cancellation happens "on-the-fly" within the conversion process.

FIG. 1A shows a general block diagram of a sigma-delta analog-to-digital converter, where the input signal and the DAC output signal can be differential, the loop filter can incorporate one or multiple feedback or feed-forward loops. The input signal is always taken with a positive sign, and the DAC taken with a negative sign since it acts as a feedback in order for the sigma-delta loop to be stable.

Figure 1B:
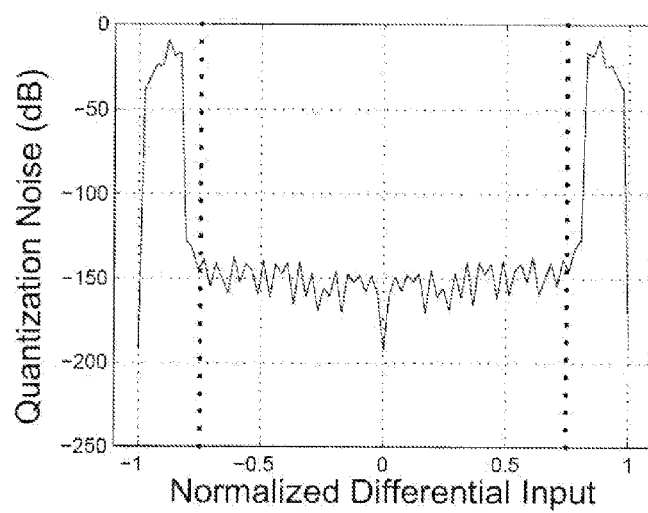
FIG. 1B shows typical quantization noise distribution versus ratio of input signal to reference signal for a sigma-delta analog-to-digital converter of FIG. 1A, with a third-order loop and a single-bit DAC.

FIG. 1B shows typical quantization noise distribution versus ratio of input signal to reference signal for a sigma-delta analog-to-digital converter of FIG. 1A, with a third-order loop and a single-bit DAC, which demonstrates the need for a scaling factor at the input to ensure the stability of the modulator on the whole input dynamic range.

Figure 2:
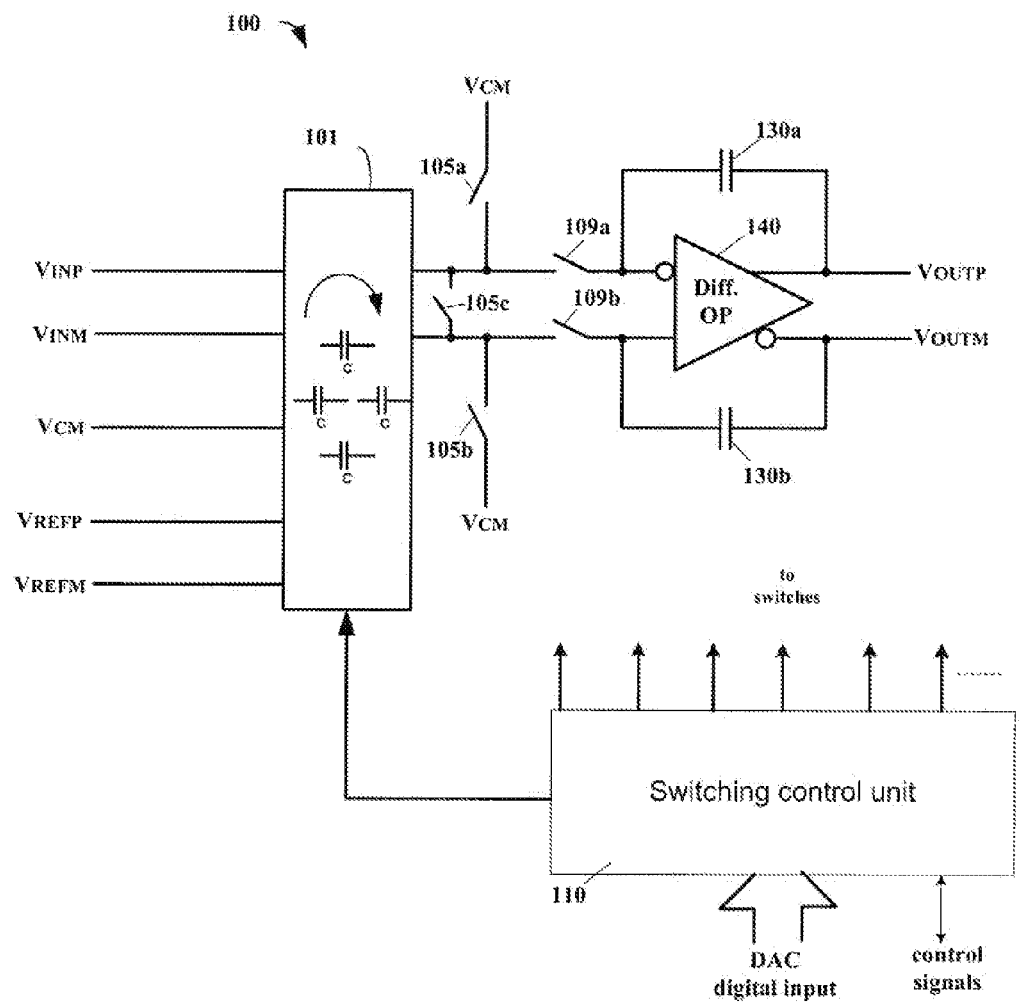
FIG. 2 shows a general embodiment of a differential voltage front-end stage for use in a sigma-delta ADC using the 2-phase algorithm that performs gain scaling and gain error cancellation.

FIG. 2 shows a first general embodiment of a front end for use in a sigma-delta modulator using rotating capacitors. Here, a differential input signal $V_{INP}$, $V_{INM}$ a differential reference signal $V_{REFP}$, $V_{REFM}$ and a common mode voltage $V_{CM}$ is fed to an input switching unit 101. Switching unit 101 comprises respective switches and a plurality or set of capacitor pairs to sample the input signal, the reference signal, or the common mode voltage to respective capacitors as will be explained in more detail below. Switching unit 101 may comprise a plurality of capacitor pairs that can be connected to the output of the unit 101. In one embodiment, the switching unit 101 may comprise two pairs of capacitors wherein each pair can be coupled to either the input signals, the reference signals, or the common mode voltage. However, more capacitor pairs can be provided. Unit 101 is operable to select respective pairs from the set to connect to the input signal, to the reference signal, or to the common mode voltage depending on control signals provided by a switching control unit 110. Switching unit 101 provides a single differential output signal which can be fed through a further switching network, for example, switches 105 and 109, to differential amplifier 140 as will be explained in more detail with respect to FIGS. 3A and 3B. There are many ways in providing a coupling of the capacitors in unit 101. Thus, switching control unit 150 generates as many control signals as necessary to control the switches in unit 101. For example, if unit 101 includes 10 switches, then control unit 110 may generate 10 distinct signals. However, if certain switches are controlled in a complementary fashion, meaning that when one switch is on another switch is always off and vice versa, less control signals may be generated by control unit 110 and switching unit 101 may include respective inverters to generate the necessary control signals from a common control signal.

Figure 3A:
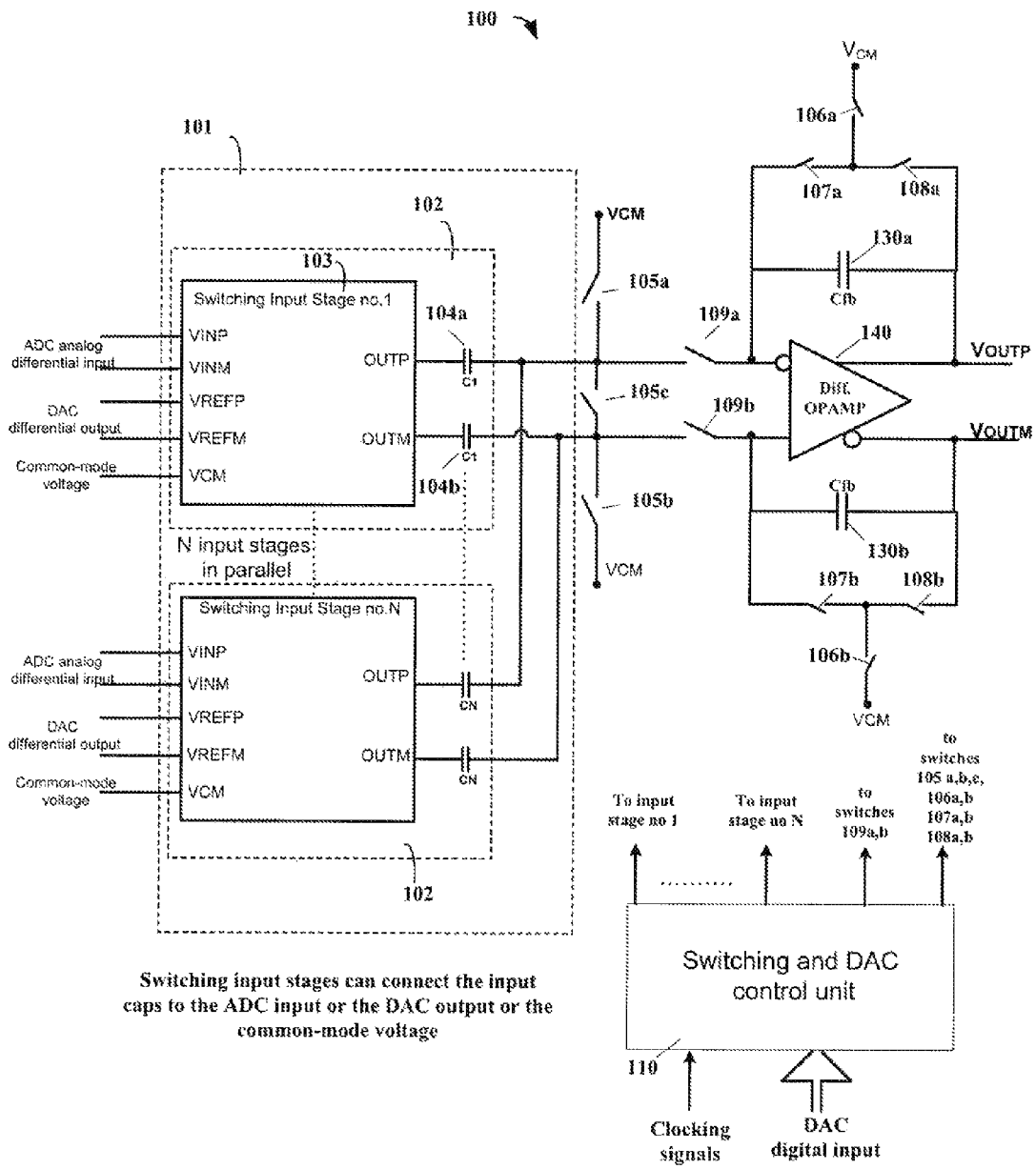
FIG. 3A shows a first more detailed embodiment of a differential voltage front-end stage for use in a sigma-delta ADC using the 2-phase algorithm that performs gain scaling and gain error cancellation.

FIG. 3A shows a first more detailed embodiment of a differential voltage front end for use in a sigma-delta modulator using a 2-phase scaling and gain error cancellation algorithm. Again, the front-end stage 100 is an integrator stage meant to be the front-end of the loop filter 10 in FIG. 1A. The structure of this integrator stage is classical as it is a traditional differential structure composed of a switched input capacitor stage 101 followed by a differential operational amplifier 140 with feedback capacitors 130a and 130b that store and integrate the charges sampled on the inputs capacitors. The switches 107a, 107b, 108a and 108b are resetting the charge stored on the feedback capacitors while in reset mode, while the switches 106a and 106b are maintaining a fixed common-mode voltage $V_{CM}$ (generated outside the block) in between switches 107 and 108 while in operation for avoiding leakage currents through them. All clocking and control signals necessary for the switches are provided by the switching control block 110.

Each sample is composed of two phases P1 and P2 (P1 being the sample phase and P2 the transfer phase), separated by a non overlapping delay for removing charge injection issues. On the phase P1, the switches 105a, 105b and 105c are turned on, forcing the common-mode voltage at the output of the block 101. During this phase, switches 109a and 109b are turned off. Then, after a non-overlapping delay, the input voltages are sampled on the input capacitors 104a, 104b present inside the switching input block 101. After another non-overlapping delay, on the phase P2, the 105a, 105b and 105c are turned off and another input voltage can be sampled on phase P2. Then, the switches 109a and 109b are turned on and the sampled charge is transferred to the capacitors 130a and 130b by the means of the differential amplifier 140 and realizes the desired integration function.

According to various embodiments, the sigma-delta ADC differential input signal $V_{IN}=V_{INP}-V_{INM}$, the differential DAC output ($V_{DAC}=V_{DACP}-V_{DACM}$) and the common-mode signal VCM are fed to an input switched-capacitance unit 101 comprising N (N integer) input stages 102, each of these stages being composed of a switching input stage 103 followed by a set of capacitors of equal value 104a and 104b connected in differential. Each of these stages 103 is controlled independently by the switching control block 110. At each sample, these input stages are assigning one of the analog voltages ($V_{IN}$, $V_{DAC}$ or $V_{CM}$) to be sampled on the capacitors 104a and 104b and transferred to the capacitors 130a and 130b. The choice of this assignment is defined in the switching control block 110 and follows a rotation algorithm which can vary it at each sample.

In order to achieve a scaling factor of S/R in this input stage, at each sample, a number S of input stages are assigned to sample the ADC input during the sample on the 104a, 104b corresponding capacitors, as well as R input stages are assigned to the sample the DAC output, the rest of the stages N−(R+S) are connected to the common-mode voltage $V_{CM}$ so that they do not contribute to any additional charge during the transfer phase. All the capacitors 104a and 104b being in parallel, the total charge sampled if all capacitors have the same unit capacitance C is equal to $C*S*V_{IN}-C*R*V_{DAC}=R*C*(S/R*V_{IN}-V_{DAC})$ which shows that an S/R scaling factor between input and DAC sampled charges is achieved in this embodiment of the input stage 100. For further simplicity, the N−(R+S) unused capacitors (transferring zero charge) will only be assigned to VCM during the whole conversion. They will only be used if another scaling factor is needed and they will not be part of the rotation algorithm.

Since the capacitances 104 have mismatch errors due to the analog process, each capacitance value of the R+S capacitors used for the DAC or input signal charge transfers can be written $C_i=C+e_i$ where $e_i$ is the mismatch error of the i-th capacitor. Here, the sum of the errors ei on all R+S capacitors is equal to 0 (if it is not the case, one can always return to this case by changing the value of C). The sum $C*S*V_{IN}-C*R*V_{DAC}$ will be modified to $C*S*V_{IN}-C*R*V_{DAC}+(e_1+\ldots+e_S)*V_{IN}-(e_S+\ldots+e_{S+R})*V_{DAC}$. The final two terms are representing the charge error transferred due to the mismatch of the capacitors. It should be noted that this charge is depending on three items: the input signal, the DAC output signal and the choice of the repartition (or assignment) of the R+S capacitors 104 to sample either the input signal or the DAC signal. Since the input is considered stable (or at a much lower frequency than the sample frequency) during each sample, only two variables remain to be averaged in order to achieve a charge error that can be cancelled out of the total sum of charges transferred during a conversion.

With respect to FIGS. 2 and 3A,B, at each sample, the rotation algorithm controlled by the switching control block 110 ensures that S switching stages are assigned to the ADC input, R stages to the DAC output and N−(R+S) stages to the common-mode and that this assignment varies so that in average over a sufficient amount of samples, the capacitors 104a and b of each stage actively used to sample charges (discarding the capacitors that may be connected all the time to the common mode voltage which charge transfer contribution is zero) have been assigned S/R times more to sample the signal than to sample the DAC voltages. If the DAC voltage is considered stable during the rotation algorithm, the sum over all permutations of the error terms in the charge transfers will be equal to zero at the end of the rotation cycle using the property that the sum of all error terms is equal to 0.

For example in a simple rotation and an S/R scaling factor, in the sample no. 1, $e_1*V_{IN}\ldots e_S*V_{IN}$ are the error terms relative to the input signal, and $e_{S+1}*V_{DAC}\ldots e_{S+R}*V_{DAC}$ are the error terms relative to the DAC signal, the error term can be written as previously stated $(e_1+\ldots+e_S)*V_{IN}-(e_{S+1}+\ldots+e_{S+R})*V_{DAC}$. In the second sample, the assignment of each capacitor is shifted by one count so that the error term can be written: $(e_2+\ldots+e_{S+1})*V_{IN}-(e_{S+2}+\ldots+e_{S+R}+e_1)*V_{DAC}$. At the R+S-th sample, the error term can be written: $(e_{R+S}+e_1\ldots+e_{S-1})*V_{IN}-(e_S+\ldots+e_{S+E-1})*V_{DAC}$. In this case ($V_{IN}$ and $V_{DAC}$ are supposed constants), the total sum of charge error terms after R+S samples is $S*(e_1+\ldots+e_{S+R})*V_{IN}-R*(e_1+\ldots+e_{S+R})*V_{DAC}$ which is equal to zero since the sum of errors ei is equal to zero. This demonstrates that when the DAC is stable, a simple cyclical shift in the assignments of the capacitors 104 cancel the gain error induced by capacitors mismatch after only R+S samples when a scaling factor S/R is required at the input between the DAC and the input signals.

This rotation algorithm may be enhanced to be depending on the DAC input level, in order to overcome possible non-linearity issues when the DAC input is not stable (which is the general case), so that for each distinct input level k (or bit-stream state) corresponding to a DAC output voltage $V_{DACk}$, a separate cyclical rotation algorithm that follows the same rules than here above would be applied, because within this separate algorithm, the DAC voltage can now be considered constant. In this case, the total error term may be cancelled only if all the error terms related to each $V_{DACk}$ are cancelled separately.

In any case, when the conversion includes a sufficiently large number of samples (when OSR>>(S+R)*nlev, where nlev is the number of possible levels in the DAC, OSR being the oversampling ratio, or the total number of samples per conversion), the error term may be neglected in regard to the total charge transferred so that the overall gain error is reaching low ppm error levels as desired.

Figure 3B:
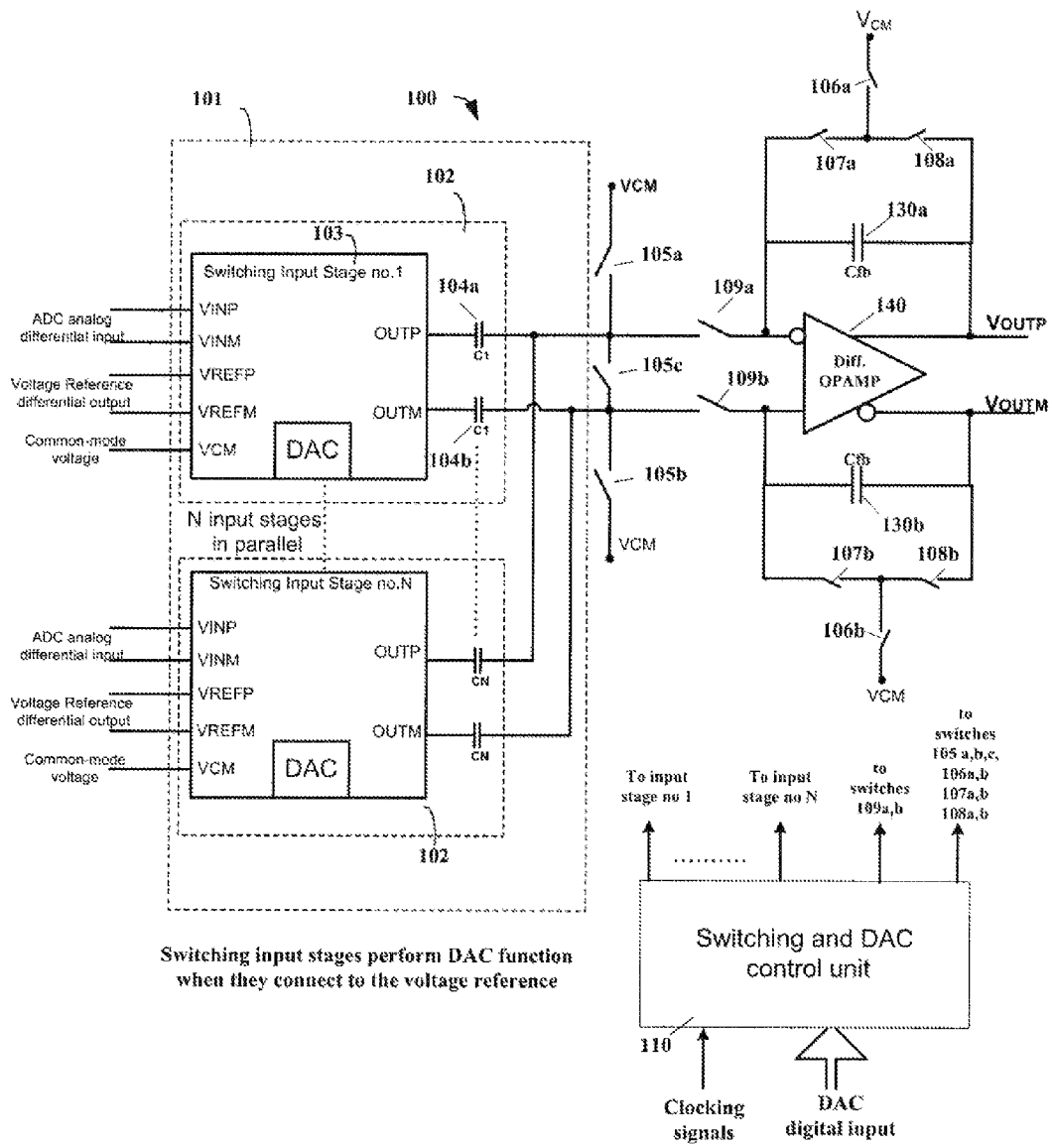
FIG. 3B shows a second more detailed embodiment of a differential voltage front-end stage for use in a sigma-delta ADC using the 2-phase algorithm that performs gain scaling and gain error cancellation, where the voltage reference is directly connected to the switching input stages and where the switching input stages perform the DAC function internally.

FIG. 3B represent the same input stage 100 where the DAC function is performed directly by the N switching input stages 103. These stages are connected to a differential voltage reference source, generated outside of the input stage 100. The switching input stages 103 are here simply composed of a DAC connected to the differential voltage reference and an analog multiplexer that can switch between the output of the DAC, the ADC differential analog input signal and the common-mode voltage. The rest of the integrator is similar to the FIG. 2 and this block performs the 2-phase scaling and gain error cancellation rotation algorithm the same way than the FIG. 2.

Figure 4:
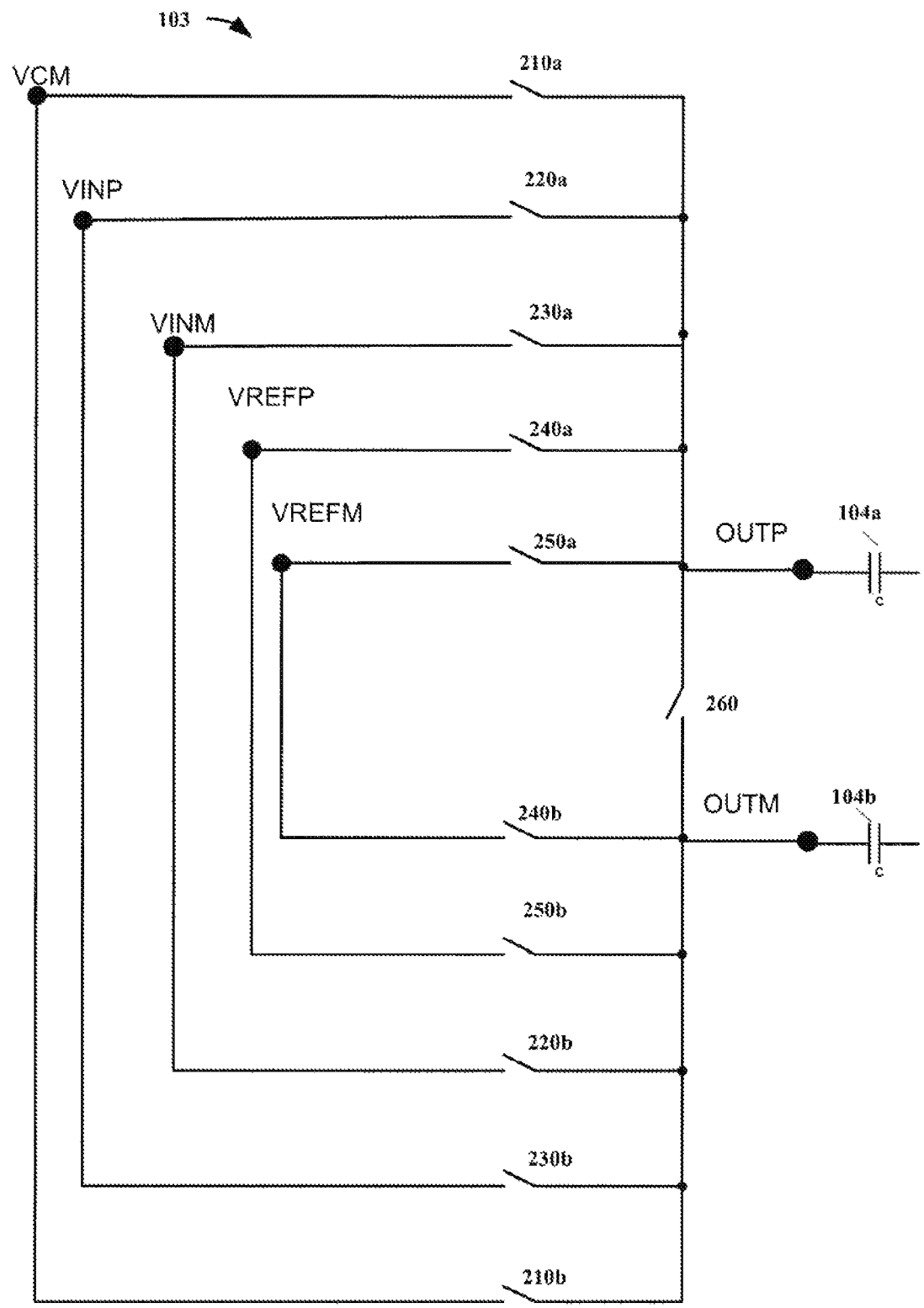
FIG. 4 shows a typical embodiment of a switching input stage unit that selects among the different possible analog input voltages to be sampled on the unit capacitors.

FIG. 4 represent a possible embodiment of the switching input stage 103 that can be used in both FIGS. 3A and 3B in order to realize the voltage assignment to the input sampling capacitors 104. This circuit can also be used as a DAC with up to five output levels per the teachings of the U.S. Pat. No. 7,102,558 "Five-level feed-back digital-to-analog converter for a switched capacitor sigma-delta analog-to-digital converter". This circuit is a simple differential analog multiplexer, and typically can assign any couple of input signals chosen from $V_{CM}$, $V_{INP}$, $V_{INM}$, $V_{REFP}$, $V_{REFM}$ to the outputs OUTM and OUTP, with a possibility of shorting the outputs OUTP and OUTM together. All the switch commands are generated by the switching control block 110, synchronously with the two phases necessary for sampling and transferring the signals to the integrator outputs.

In FIG. 4, the OUTP signal can be connected to the voltages $V_{CM}$, $V_{INP}$, $V_{INM}$, $V_{REFP}$, $V_{REFM}$ respectively through the switches 210a, 220a, 230a, 240a, 250a. When any of these switches is on, all others are off to avoid short circuits between the analog inputs. At the same time, the OUTM signal can be connected to the voltages $V_{CM}$, $V_{INP}$, $V_{INM}$, $V_{REFP}$, $V_{REFM}$ respectively through the switches 210b, 230b, 220b, 250b, 240b. Similarly, when any of these switches is on, all others are off to avoid short circuits between the different analog inputs. The switch 260 can short the two outputs OUTM and OUTP together. In this case the switches 210 can be off or on depending if the OUTM and OUTP signals need to be connected to the $V_{CM}$ voltage.

In the reset state, the 210 and 260 switches are on while all other switches are off, so that no differential charge is stored on the capacitors 104a and 104b. During the conversion, during each of the two phases (P1: sampling, P2: transferring), a differential voltage is selected and sampled on the 104a and 104b capacitors by switching on one of the switches 210a, 220a, 230a, 240a, 250a and one of the switches 210b, 230b, 220b, 250b, 240b leaving all other switches off, or by switching 260 on and leaving all other switches off. Between the two phases, during the non-overlapping delay, all the switches are off.

Figure 5E:
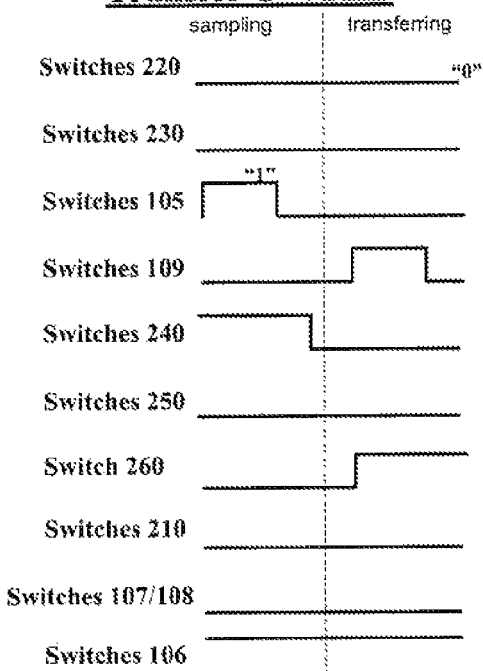
Figure 5F:
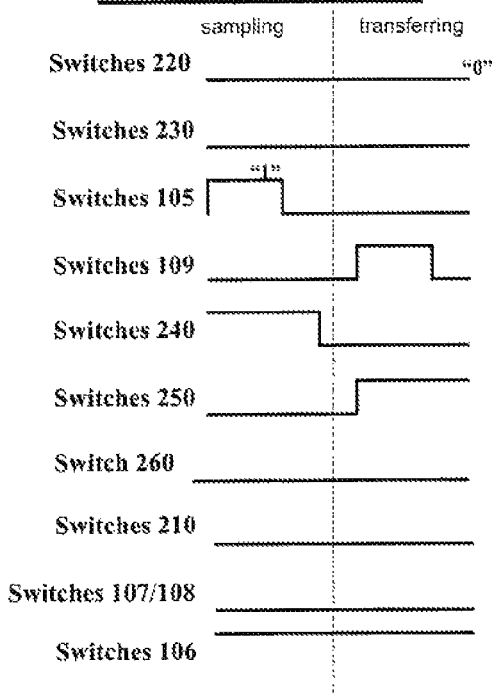
Figure 5G:
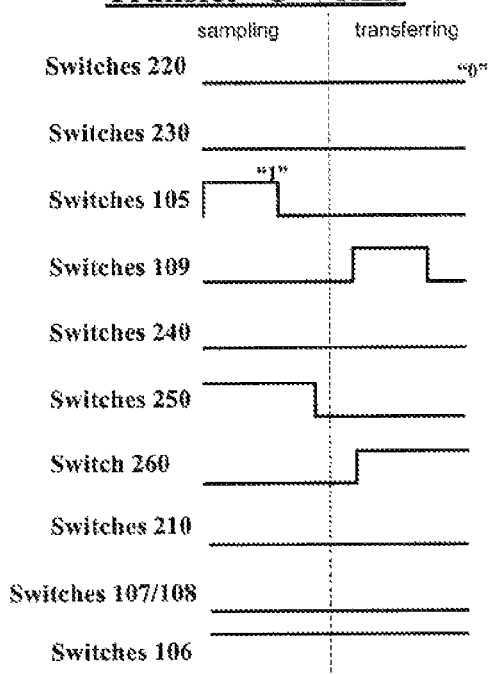

In the case of the FIG. 3A, where the DAC is connected to the switching input stages 103, the FIGS. 5a, 5c, 5g represent the reset state (used for the capacitors not participating to the charge transfers) and the possible charge transfers with all the associated digital switch commands that are needed to sample and transfer charges from either the input signal, the DAC output or the common-mode voltage.

The FIG. 5a is used for resetting the charge stored on the capacitors 104, while the switches 105 are on and the switches 109 are off. In this case, the $V_{CM}$ voltage is applied at both ends of the capacitors 104, which ensures the proper discharge of these capacitors. Choosing this configuration will act as disabling the corresponding switching input stage. The modulator will act as if this stage was not present since it does not transfer any charge.

The FIG. 5c describes a charge transfer of $C^*V_{IN}=C^*(V_{INP}-V_{INM})$. This transfer is applied when a set of capacitors 104 is assigned by the switching control unit to sample and transfer charges from the differential input of the sigma-delta ADC. In the phase P1, the switches 220 are on, while all other switches in the 103 switching unit are off, which samples a charge $C^*V_{IN}=C^*(V_{INP}-V_{INM})$ on the 104 capacitors. In the phase P2, the OUTM and OUTP are shorted together, through the switch 260 that is on. All other switches are off in the block 103, including the switches 210, which guarantees that the input common-mode is not transferred through the charge transfer.

The FIG. 5g describes a charge transfer of $-C^*V_{REF}=-C^*(V_{REFP}-V_{REFM})$. This transfer is applied when a set of capacitors 104 is assigned by the switching control unit to sample and transfer charges from the differential input of the sigma-delta ADC. In the phase P1, the switches 250 are on, while all other switches in the 103 switching unit are off, which samples a charge $-C^*V_{REF}=-C^*(V_{REFP}-V_{REFM})$ on the 104 capacitors. In the phase P2, the OUTM and OUTP are shorted together, through the switch 260 that is on. All other switches are off in the block 103, including the switches 210, which guarantees that the input common-mode is not transferred through the charge transfer. The transfer of the charge is $-C^*V_{REF}$ due to the negative sign of the feedback loop as shown in the FIG. 1 where the DAC output is taken negatively by the loop filter 10.

The transfers described here above (corresponding to the FIGS. 5a, 5c and 5g) are sufficient to cover all cases of the rotation algorithm when the DAC output voltage is generated outside of the switching units 103 which is the case of the FIG. 2. However a transfer of twice the charge can be envisaged instead of the transfers 5c and 5g, which leads to an improved signal-to-noise ratio during the transfer by a factor sqrt(2). These charge transfers are described with the FIGS. 5d and 5h. If these two transfers are used in place of the transfers described in the FIGS. 5c and 5g, the scaling factor is still respected between the input signal and the DAC, but a gain of 2 is realized in the integrator. This gain can be set back to 1 by doubling the size of the feedback capacitors 130.

Figure 5H:
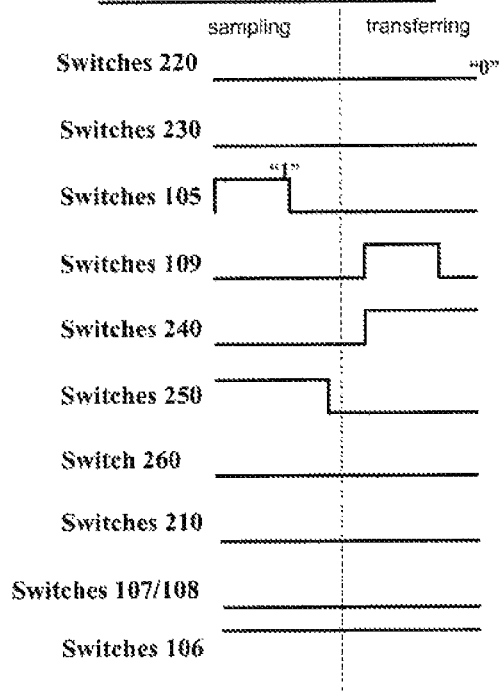

In both FIGS. 5d and 5h, the first phase is identical to FIGS. 5c and 5g so that at the end of the first phase, a charge $C^*V_{IN}$ or $-C^*V_{REF}$ is sampled on the capacitors 104. In the second phase, the difference is that instead of shorting the capacitors 104 through the switch 260, the capacitors 104 are connected to the opposite voltage than in the first phase ($-V_{IN}$ for the FIG. 5d and $+V_{REF}$ for the FIG. 5h). With this connection, the transferred charge, being the difference of the charge loaded on the 104 capacitors between the two phases, is twice more than when the capacitors are shorted together on the second phase. This principle is similar to the one leading to the U.S. Pat. No. 7,102,558 "Five-level feed-back digital-to-analog converter for a switched capacitor sigma-delta analog-to-digital converter", which is hereby incorporated by reference, where the five levels are created within the two phases of each sample.

Since single or double charge transfers can be realized on each capacitor 104 through the FIGS. 5c, 5d, 5g and 5h, this property can be used to realize gain scaling factors of ½ or 2 easily by setting a double transfer in either input signal charge transfers or DAC charge transfers while setting single charge transfers respectively on the DAC charge transfers or input signal charge transfers. Another usage can simply be improving the signal-to-noise ratio by setting double transfers on each charge transfer (by using only 5d and 5h figures). During double transfers, the DAC and the input signal source need to be able to source enough current to overcome twice the regular single transfer voltage difference across the 104 capacitors so that the voltage across each capacitor 104 still respects a settling time inferior to each phase timing (typically one half of the sample period).

As shown in the FIG. 3B, a simple differential voltage source can be connected to the reference inputs of each stage 103, and in this case, each stage comprises a DAC that is controlled by the switch control block 110 that receives the bitstream and thus the DAC inputs. In this case, the DAC may be limited in its resolution to a small number of output levels, typically two (one bit DAC). This limitation comes from the fact that each switching stage 103 needs to comprise a DAC, and thus only simple DACs are practical to implement even in the case of a relatively small number N of stages 103.

The FIG. 4 can be used to realize a one-bit DAC at the same time than the necessary assignments to the ADC input voltage or the common-mode voltage to perform the two phases scaling and gain error cancellation algorithm. The FIGS. 5e and 5g are showing the switch command signals required to perform a charge transfer of $C^*V_{REF}$ or $-C^*V_{REF}$ which correspond to the two possible output levels of a 1-bit DAC that would sample either $+V_{REF}$ or $-V_{REF}$ on the capacitors 104. The only difference between the two FIGS. 5e and 5g is that the switches that are on during the first phase are either the switches 240 or 250, connecting respectively the $V_{REF}$ voltage or the $-V_{REF}$ voltage to the capacitors 104.

Per the teachings of the U.S. Pat. No. 7,102,558 "Five-level feed-back digital-to-analog converter for a switched capacitor sigma-delta analog-to-digital converter", the FIG. 4 can also be used to realize a five-level DAC at the same time than the necessary assignments to the ADC input voltage or the common-mode voltage to perform the two phases scaling and gain error cancellation algorithm. The FIGS. 5b, 5e, 5f, 5g and 5h are showing the switch command signals required to perform a charge transfer of $C^*0$, $C^*V_{REF}$, $C^*2V_{REF}$, $C^*(-V_{REF})$ and $C^*(-2V_{REF})$ which correspond to the two possible output levels of a five-level DAC that would sample either 0, $+V_{REF}$, $-V_{REF}$, $+2V_{REF}$ or $-2V_{REF}$ on the capacitors 104. These switch commands signals are similar to the ones shown in the US patent mentioned here above and included here as a cited reference. In this case, in order to have a proper scaling factor S/R, the FIG. 5d should be used to perform an assignment of the ADC input signal to the capacitors 104 so that a double charge transfer would be realized and so that no additional gain factor would be realized between input signal and DAC signal charge transfers (the five-level DAC being able to lead to a double charge transfer too with FIGS. 5g and 5h).

FIG. 6 shows a simple representation of the assignment of each capacitor pairs 104 during a given sample number. FIG. 6a generally shows an example of a cyclical representation of the N input stages at a given sample number. In FIG. 6a, the number N of stages 103 is equal to 5, five pairs A, B, C, D, and E of capacitors 104 may be provided as shown in FIG. 3B. Each pair can be assigned to the ADC input signal, or the reference signal (here the DAC function is performed inside each input stage 103), or to the common-mode signal (so that they do not contribute to the charge transfers). The figures representing switch commands used for the ADC input signal charge transfers can be 5c and 5d. The figures representing switch commands used for the reference or DAC charge transfers can be 5b, 5e, 5f, 5g and 5h. The figure representing switch commands used for the common mode assignment is 5a. Each of these three cases is represented with a different fill pattern with a cyclical diagram as shown in FIG. 6. For example, in FIG. 6b, N=5 and the input stages are called A, B, C, D and E. A, B, C are used for the reference or the DAC, D is used for the signal and E is unused. Gain scaling is ⅓ (number of input signal stages/number of reference signal stages). In the configuration of FIG. 6c, C is used for the reference or the DAC, A, B are used for the signal, D and E are unused. Gain scaling is 2 (in this configuration the input stages are amplifying the signal). On the first example in FIG. 6b, the capacitor pairs A, B and C are assigned to the voltage reference inputs, while the capacitor pair D is assigned to the ADC inputs and the capacitor pair E is unused and stays in the reset state as described in FIG. 5a. The gain scaling factor (without counting a potential gain of ½ or 2 due to a single or double charge transfer) is then ⅓ between the ADC input and the reference input. On the last example in FIG. 6c, the capacitor pairs A, B are assigned to the ADC inputs, while the capacitor pair C is assigned to the voltage reference inputs and the capacitor pairs D and E are unused and stay in the reset state as described in FIG. 5a. The gain scaling factor (without counting a potential gain of ½ or 2 due to a single or double charge transfer) is then 2 between the ADC input and the reference input.

The scaling factor S/R can be inferior to 1 in order to ensure stability of high-order modulators, but it can also be superior to 1 in order to generate additional gain in the system and be able to resolve smaller signals at the sigma-delta ADC inputs. The assignment selection (and thus the S/R ratio) can be set differently within each conversion so that multiple gains are possible with the same number of capacitor pairs. This is made possible by the fact that some capacitor pairs can be disabled and thus will not contribute to the charge transfers and will not modify the S/R ratio. In each of the FIG. 6 examples, the capacitors that stay in the reset state do not modify the scaling factor, but could be used in another configuration if another gain was to be achieved.

FIG. 7 shows a simple representation of a DAC independent rotation algorithm using five capacitor pairs and a scaling factor of ⅔. Here, at any sample, two capacitor pairs are assigned to an ADC input charge transfer, and three capacitor pairs are assigned to a reference charge transfer. In the reset state (sample no. 0), all capacitors are tied to the $V_{CM}$ (using FIG. 5a commands). At the first sample, capacitor pairs A and B are assigned to the ADC inputs, and capacitors C, D and E are assigned to the reference charge transfers.

In this simple rotation algorithm, the assignment will shift at each sample by one unit so that at the second sample as shown in FIG. 7, the capacitors B and C will be assigned to the ADC inputs and the capacitors D, E and A will be assigned to the reference inputs. After five samples, the capacitors E and A are assigned to the ADC inputs and the capacitors B, C and D are assigned to the reference inputs. After these R+S=5 samples, each capacitor pair has been assigned exactly S=2 times the ADC inputs and R=3 times the reference inputs, ensuring that even if the capacitors are showing mismatch errors, the S/R=2/3 ratio is well respected on each capacitor pair. If $V_{IN}$ and $V_{REF}$ are considered constant during this set of R+S samples, the gain error is then totally cancelled at the output of the integrator. After R+S samples, the rotation algorithm takes the same state than on the first sample, and continues its shifting during the whole conversion that has OSR samples (typically with OSR>>R+S).

As a first drawback, if the rotation algorithm is stopped after a number of samples not multiple of R+S, a small gain error residue will not be cancelled. The other drawback of this algorithm is that the DAC output can rarely be considered constant during the conversion. In order to overcome this second drawback, a DAC input dependent algorithm can be put in place like in the FIGS. 8 and 9.

Figure 9:
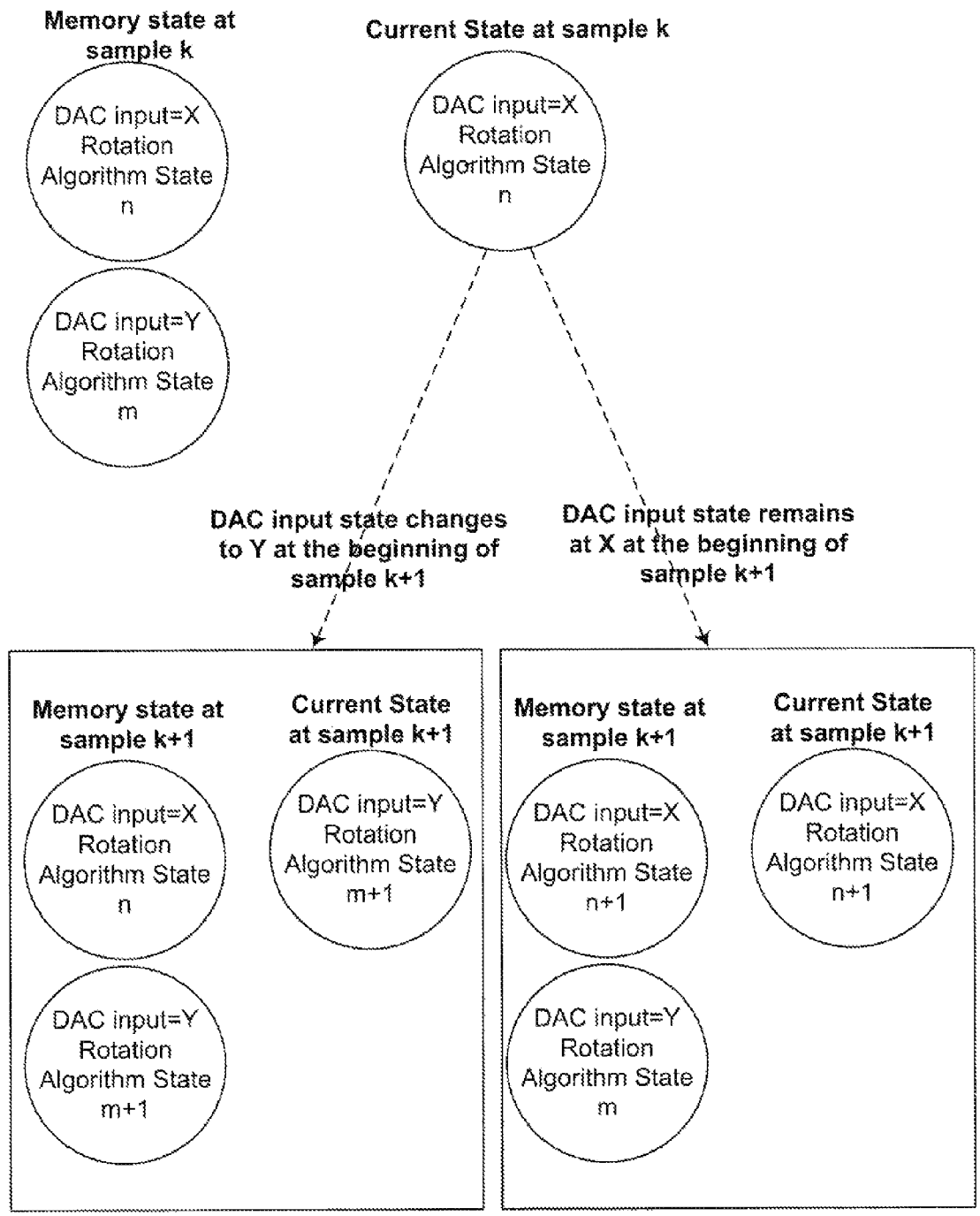
FIG. 9 shows the state diagram for the rotation algorithm that is depending on the DAC states (DAC input dependent algorithm) and that performs gain scaling and gain error cancellation.

The FIGS. 8a and b shows the same configuration (N=R+S=5) and gain scaling (S/R=2/3) than in FIG. 7 but with a DAC input (or bitstream) dependent algorithm. There are as many rotation cycles as there are DAC levels. The DAC input selects the rotation cycle corresponding to its input. For each sample, the configuration takes the next state in the cycle of the corresponding new DAC input. In this example, the DAC is a simple 1-bit DAC, so there are two possible output levels. However this algorithm can easily be extended to a multi-level DAC without any restriction on the resolution as shown in FIG. 9. The FIGS. 8a and b shows an example of a given bitstream: 100010 and the associated assignments at each sample of this given bitstream. The principle of the DAC input dependent algorithm is the following: For each given DAC state, the system will use a simple rotation algorithm as described in FIG. 7. There will be as many cycles as there are possible DAC output levels.

In the FIGS. 8a and b, the DAC can take two possible input levels: 0 or 1. Once this state is determined, the switching control unit 110 will select the cycle corresponding to the current DAC state and will shift by one unit the assignments of the capacitors 104 as a simple rotation algorithm. Since there are only two possible DAC input states, there will be two cycles to choose from. For the first sample, the DAC input state is "1", the capacitors A and B are assigned to an ADC input charge transfer and the capacitors C, D and E are assigned to a reference input charge transfer. This state, called the "1"-state, is saved into a memory so that the next time the DAC takes the "1" input state, the algorithm will continue its rotation based on this saved state and will switch to the next one. For the second sample, the DAC input state is 0, so the switching control unit toggles to the "0"-state cycle, which also starts with the same assignments than the "0"-state cycle. So in the second sample, the capacitors A and B are assigned to an ADC input charge transfer and the capacitors C, D and E are assigned to a reference input charge transfer.

The FIG. 8a represents the "1"-state simple rotation algorithm samples, and the FIG. 8b represents the "0"-state simple rotation algorithm samples. Each of the figures show a simple rotation algorithm, independent from each other and simply depending on the DAC input state and the number of the sample at this given DAC input state.

As shown in the FIG. 8a, the "1"-state algorithm changes state only when a "1" state is detected by the switching control block 110 and that happens at the $5^{th}$ sample in this example. During the $2^{nd}$, $3^{rd}$ and $4^{th}$ sample a "0" is generated by the quantizer 20 so this "1"-state algorithm is freezed and the "0"-state algorithm is used.

As shown in FIG. 8b, with the given bitstream 100010, the $2^{nd}$, the $3^{rd}$ and the $4^{th}$ samples are all "0" state for the DAC input. In this case, the "0"-state rotation algorithm is selected and the assignments are shifted by one unit on each sample so that at the $4^{th}$ sample, the state that is saved is: C and D are assigned to ADC input, and A, B and E are assigned to reference inputs. This saved state is only corresponding to DAC inputs that are equal to 0. The next time the DAC will take a "0" input, the assignment will switch to the next one following this saved state and following the simple rotation algorithm. This is shown on the $6^{th}$ sample, where the DAC input state is "0" and the assignment is then D and E for the ADC inputs and A, B and C for the reference inputs.

Once the "0"-state and the "1"-state have fully completed their independent rotation algorithms, the gain error is cancelled in the integrator, since during these algorithms the DAC input is stable (which was the criteria to meet for cancelling this gain error). If the DAC has more than two levels, the algorithm can be expanded easily, each input state can have its own rotation algorithm cycle with its own memory to save the last state before switching to another cycle.

If the number of samples each input state of the DAC is taken is not a multiple of R+S, the gain error will be a function of the residue that each independent rotation algorithm cycle will bring for not being fully executed. This residue is typically small if nlev*(R+S)<<OSR where nlev is the number of possible input states of the DAC.

The FIG. 9 describes the general case of a DAC dependent rotation algorithm with any resolution, and with any rotation algorithm envisaged. This figure represents a transition between any DAC input state X at a certain sample k and the next DAC input state at the sample k+1. This next sample state can be either X (the DAC input is unchanged) or Y, Y different than X. At the top of the diagram, the current state of the converter and the associated memories that store the previous states of the rotation algorithm are depicted. Here, the current state is the following: The DAC input is equal to X, and the rotation algorithm is at the position n for the "X"-state cycle. In the memories, for the "X"-state cycle, the position n is stored since the converter is currently in this position for the sample k. Here we also show that the previous state for the "Y"-state memory is the position m.

When the transition from the sample k to the sample k+1 happens, the DAC input takes a new value given by the quantizer 20. This value is either the same (X), or different (Y). The two possibilities are depicted at the bottom of the FIG. 9. Based on this value, the switching control block 110 selects either the "X"-state algorithm or the "Y"-state algorithm.

When the DAC input is the same at the sample k+1, the DAC dependent rotation algorithm stays in the "X"-state cycle. The position attained in this cycle is then n+1. It should be noted that since this algorithm is a cycle, the positions are the same with a certain modulo (typically modulo R+S). The memory associated to the "X"-state also shifts to the position n+1. The memory associated to any other position Y, Y different than X, does not change since the "Y"-state rotation cycle has not been selected at the beginning of the sample.

When the DAC input is different at the sample k+1, equal to Y, Y different than X, the DAC dependent rotation algorithm selects the "Y"-state algorithm. Since the last position on this cycle was the position m, the position at the sample k+1 is now m+1. It should be noted that the position m for the "Y"-state algorithm may have been attained a large number of samples before the sample k+1. The memory for the "Y"-state algorithm is now updated to the position m+1 and the memory for the "X"-state or any other state is unchanged since the algorithm is in the "Y"-state cycle.

At the end of the conversion, the gain error due to mismatch of capacitors 104 is largely reduced or cancelled if most or all of the DAC depending state cycles have performed their rotation partially or totally, and if each of the residue of each algorithm induces a negligible charge error compared to the total charge transferred during the full conversion. This is generally the case when nlev*(S+R)<<OSR in the case of simple shift cycle algorithms.

According to further embodiments, it is possible to combine the above described switching algorithm with a Chopper voltage reference and provide at the same time for a DAC that is inherently linear and for a removal of offset and 1/f noise induced by the reference circuit. There is no need to modify the chopper voltage reference circuit. A typical chopper stabilized bandgap voltage reference is more fully described in U.S. Pat. No. 6,462,612, entitled "Chopper Stabilized Bandgap Reference Circuit to Cancel Offset Variation" by Roh et al., and is incorporated by reference herein for all purposes.

Figure 10:
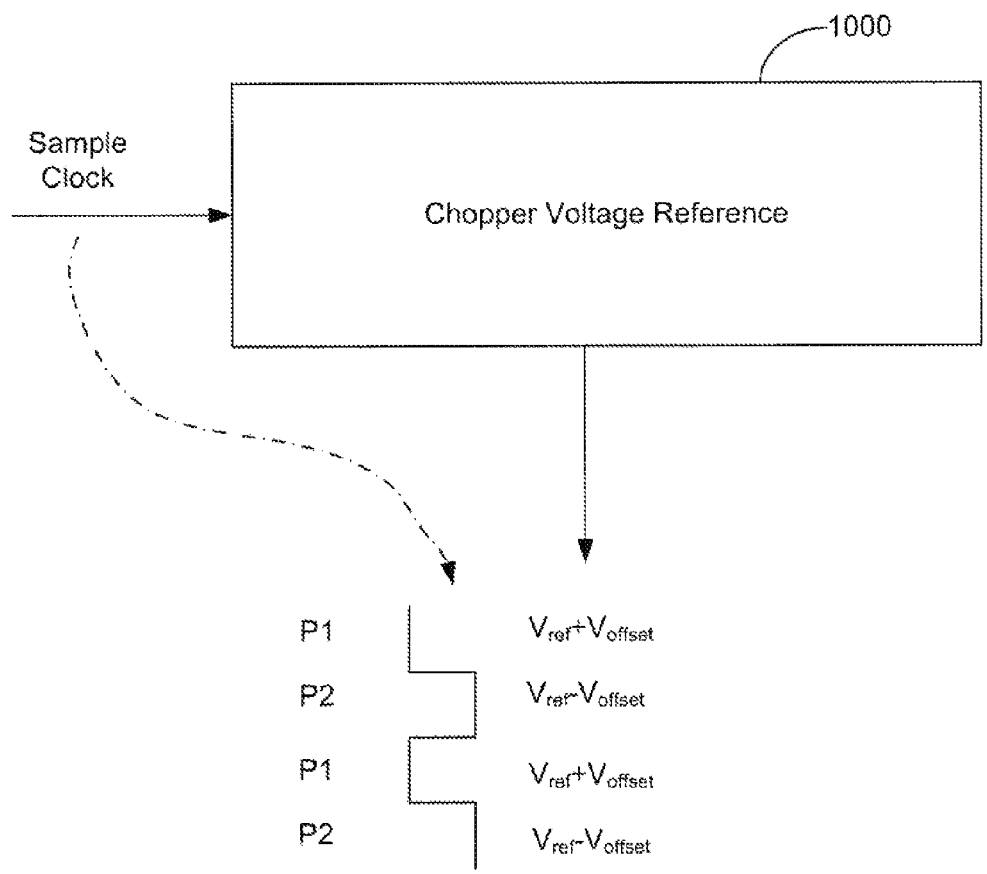
FIG. 10 shows a block diagram of a chopper voltage reference.

The chopper voltage reference may be preferably clocked by sample clock. FIG. 10 shows an example of a chopper voltage reference 1000. The voltage reference receives for example the sample period clock which defines the sample phase P1 and transfer phase P2. As shown in FIG. 10, it is characteristic for a chopper voltage reference that the output reference voltage changes with the chopper clock such that it toggles between $V_{ref}+V_{offset}$ and $V_{ref}-V_{offset}$. However, other toggle schemes may apply as long as it is known which parameter of the chopper clock controls a positive or negative offset voltage. In other words, it is the state of the chopper output which is used as a parameter. The relationship of positive and negative offset is thus known. In the example shown in FIG. 10 this state correlates with the sample period clock. According to further embodiments, this additional variable is used to further define which state of the algorithm for switching the capacitors is used. In other words, according to an embodiment, the value of the bitstream or the DAC output value as well as the state of the chopper voltage reference are used to define a specific status of the modulator wherein for each status the same algorithm is applied. Hence, in the present example, four different states α, β, γ, and δ can be obtained as shown in the table below.

TABLE 1

| DAC Input | Chopper offset state | State for Algorithm |
|---|---|---|
| 0 | +Vref | α |
| 1 | +Vref | β |
| 0 | −Vref | γ |
| 1 | −Vref | δ |

Figure 11:
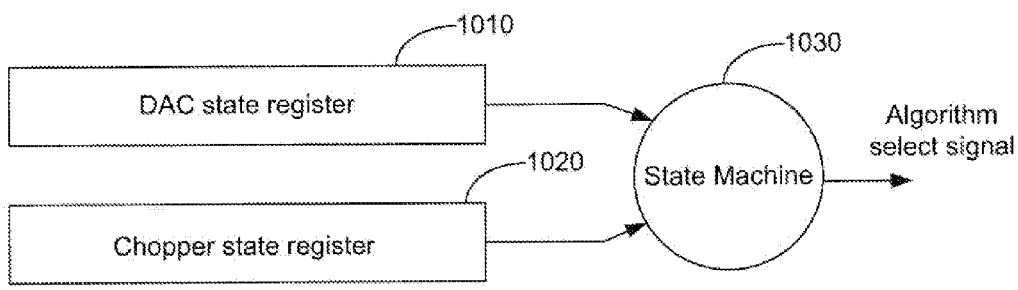
FIG. 11 shows an example of yet another rotation algorithm when a chopped voltage reference is used.

Within each state α, β, γ, and δ the same algorithm or switching sequence for the reference and input capacitors is applied. However, each state α, β, γ, and δ remembers it current sequence position and continues its switching sequence when selected similar as shown in FIGS. 8a and 8b. However, the switching sequence is now not only dependent on the state of the DAC but also on the state of the chopper voltage reference. FIG. 11 shows an application with two different bitstreams wherein a gain of ⅔ is achieved by assigning two capacitors to the input voltage and three capacitors to the reference voltage similar as the DAC input dependent algorithm showed in FIGS. 8a and 8b. In example 1, the bitstream is in sync with the chopper. Thus, only two states are used. As can be seen whenever the β-state is selected it continues to rotate the capacitors from its previous state. The same applies for the γ-Algorithm. The second example shows a bitstream that is not in sync with the chopper reference voltage. Thus, all four states are now in operation.

Thus, a state machine 1030 may be used which receives state signals from two registers or flags 1010, 1020. The state machine 1030 comprises registers or counters for each algorithm to be able to continue the sequence where it was left off when it has been previously selected.

As a consequence, the rotation needs to fully cycle for every combined state which is defined by the DAC output in combination with the offset state of the chopper voltage reference. Hence, DAC output and Chopper state define separate algorithm columns, in the example shown four different algorithm columns. Table 2 shows the four columns for a 5 capacitor input stage.

TABLE 2

| Sample number on each DAC/ Chopper state | DAC = 0 CHOP = 0 α | DAC = 1 CHOP = 0 β | DAC = 0 CHOP = 1 γ | DAC = 1 CHOP = 1 δ |
|---|---|---|---|---|
| 1 | Algorithm state A | Algorithm state A | Algorithm state A | Algorithm state A |
| 2 | Algorithm state B | Algorithm state B | Algorithm state B | Algorithm state B |
| 3 | Algorithm state C | Algorithm state C | Algorithm state C | Algorithm state C |
| 4 | Algorithm state D | Algorithm state D | Algorithm state D | Algorithm state D |
| 5 | Algorithm state E | Algorithm state E | Algorithm state E | Algorithm state E |
| 6 | Algorithm state A | Algorithm state A | Algorithm state A | Algorithm state A |
| 7 | Algorithm state B | Algorithm state B | Algorithm state B | Algorithm state B |

The above disclosed embodiments can cancel gain error and use a low noise chopper voltage reference at the same time. These embodiments are thus compatible with the offset cancellation algorithm and 5 level multi bit DAC as disclosed in U.S. patent application Ser. No. 12/581,982 "Multi-Level Feed-Back Digital-to-Analog Converter Using a Chopper Voltage reference For a Switched Capacitor Sigma-Delta Analog-to-Digital Converter", published on Apr. 29, 2010 as US 2010/0103014A1 which is hereby incorporated by reference, and therefore multiple algorithms can be combined in a single sigma-delta modulator chip. Only a small die size overhead is necessary for the Chopper implementation.

The disclosed embodiments can easily be adapted for a 5-level multibit DAC for which in addition the number of memories (columns) needed can be reduced. As shown in FIGS. 5f and 5h, in a 5-level multibit DAC the reference voltage offset is cancelled out in all even states. Thus, there is no need for a memory (column) for these DAC even states because the chopper reference voltage state does not need to be tracked as it has no influence. In other words, distinctive sequences that also distinguish between the different chopper reference voltage states need to be applied only for the DAC input +1 and −1, whereas for a DAC output of +2, −2 and 0 the chopper reference voltage does not need to be taken into account. Hence, the number of columns (α, β, γ, and δ in the 2-level example above) for a 5-level multibit DAC would be normally 10. However, as explained above, this number can be reduced to 7, with a single column for DAC output values 0, −2, +2 and two columns for −1 and +1, respectively.

However, the embodiments shown can be applied to any type of sigma-delta analog-to-digital converter with an input switched capacitance programmable amplifier (PGA).

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A sigma-delta modulator comprising:
 a chopper voltage reference providing a reference signal having a clock dependent offset voltage,
 a single-bit or a multi-bit digital-to-analog converter (DAC);
 a plurality of capacitor pairs;
 a plurality of switches to couple any pair of capacitors from said plurality of capacitor pairs selectively to an input signal or the reference signal; and
 control means operable to control sampling through said switches to perform a charge transfer in two phases wherein any pair of capacitors can be selected to be assigned to the input signal or the reference signal,
 wherein after a plurality of charge transfers a gain error cancellation is performed by rotating the capacitor pairs cyclically such that after a rotation cycle, each capacitor pair has been assigned a first predetermined number of times to the input signal, and has also been assigned a second predetermined number of times to the reference signal, and wherein an output value of the DAC and an offset state of said chopper voltage reference define a plurality of switching sequences wherein each switching sequence independently rotates said capacitor pairs and wherein at least one switching sequence is selected depending on a current output value of the DAC and a current offset state of the chopper voltage reference.

2. The sigma-delta modulator according to claim 1, wherein a switching sequence is selected from all possible switching sequences depending on a current output value of the DAC and a current offset state of the chopper voltage reference.

3. The sigma-delta modulator according to claim 1, wherein for a first sub-set of DAC output values a switching sequence is selected depending only on a current output value of the DAC and for a remaining sub-set of DAC output values, a switching sequence is selected depending on a current output value of the DAC and a current offset state of the chopper voltage reference.

4. The sigma-delta modulator according to claim 3, wherein in a five-level DAC, the first sub-set includes even output values and the remaining sub-set includes odd output values.

5. The sigma-delta modulator according to claim 1, further comprising switches to selectively couple a common mode voltage to a selected pair of capacitors.

6. The sigma-delta modulator according to claim 5, comprising a plurality of input stages, each stage comprising a capacitor pair associated switches and receiving said input signal, said reference signal, and said common mode voltage.

7. The sigma-delta modulator according to claim 1, wherein the reference signal is provided by a digital-to-analog converter comprising a bandgap chopper voltage reference.

8. The sigma-delta modulator according to claim 6, wherein the reference signal is provided by a chopper voltage reference source and each input stage comprises a digital-to-analog converter controlled by the control means.

9. The sigma-delta modulator according to claim 5, wherein for a charge transfer, during a charge phase, an input signal or reference signal is coupled on one side of a pair of capacitors and the common ground potential is coupled on the other side of said pair of capacitors and during a transfer phase, the one side of the pair of capacitors are connected with each other or coupled with an inverted input or reference signal.

10. The sigma-delta modulator according to claim 5, wherein for a zero charge, during a charge phase one side of the pair of capacitors are connected with each other and the common ground potential is coupled on the other side of said pair of capacitors, and during a transfer phase, the one side of the pair of capacitors are again connected with each other.

11. The sigma-delta modulator according to claim 1, comprising more than two pairs of capacitors wherein a gain is achieved by a ratio of the number of capacitor pairs assigned to the input signal and the number of pairs assigned to the reference signal.

12. The sigma-delta modulator according to claim 9, comprising a differential operation amplifier coupled with outputs of the input stages through a controllable switching network.

13. The sigma-delta modulator according to claim 12, further comprising first and second feedback capacitors which can be switched selectively into a negative or positive feedback loop of said differential amplifier.

14. The sigma-delta modulator according to claim 1, wherein the chopper voltage reference is clocked by a clock controlling said two phases.

15. A method of performing a charge transfer in a sigma-delta modulator using a plurality of capacitor pairs, the method comprising:
Generating a reference signal having a clock dependent offset voltage by a chopper voltage reference;
Generating a digital-to-analog converter (DAC) output value by a single-bit or a multi-bit DAC;
Providing at least two capacitor pairs to be assigned to an input signal and a reference signal;
Performing a sampling by combining a sampling of the input signal with at least one capacitor pair and in parallel a sampling of the reference signal with at least another one capacitor pair, wherein sampling is performed in two phases;
Rotating the capacitor pairs for a following sampling such that after a plurality of samplings a gain error cancellation is performed wherein after a rotation cycle, each capacitor pair has been assigned a first predetermined number of times to the input signal, and has also been assigned a second predetermined number of times to the reference signal, wherein an output value of the DAC and an offset state of said chopper voltage reference define a plurality of switching sequences wherein each switching sequence independently rotates said capacitor pairs and wherein at least one switching sequence is selected depending on a current output value of the DAC and a current offset state of the chopper voltage reference.

16. The method according to claim 15, wherein a switching sequence is selected from all possible switching sequences depending on a current output value of the DAC and a current offset state of the chopper voltage reference.

17. The method according to claim 15, wherein for a first sub-set of DAC output values a switching sequence is selected depending only on a current output value of the DAC and for a remaining sub-set of DAC output values, a switching sequence is selected depending on a current output value of the DAC and a current offset state of the chopper voltage reference.

18. The method according to claim 17, wherein in a five-level DAC, the first sub-set includes even output values and the remaining sub-set includes odd output values.

19. The method according to claim 15, wherein:
during a first sample, a first capacitor pair is used for sampling an input signal in a charge phase and transfer phase and the second capacitor pair for sampling a reference signal in a charge phase and transfer phase in parallel with said input signal;
During a following sample, using the second capacitor pair for sampling an input signal in a charge phase and transfer phase and the first capacitor pair for sampling a reference signal in a charge phase and transfer phase in parallel with said input signal.

20. The method according to claim 15, further comprising coupling each pair of capacitors with one of: a positive input signal line, a negative input signal line, a positive reference signal line, a negative reference signal line, and a common ground potential.

21. The method according to claim 15, wherein for a charge transfer, during a charge phase, the input signal or reference signal is connected on one side of a pair of capacitors which is otherwise coupled with a common ground potential, and during a transfer phase, connecting the one side of the pair of capacitors with each other or coupling the one side with an inverted input or reference signal.

22. The method according to claim 15, wherein for a zero charge transfer, during a charge phase connecting one side of a pair of capacitors with each other and connecting the common ground potential on the other side of said pair of capacitors, and during a transfer phase, connecting the one side of the pair of capacitors again with each other.

23. The method according to claim 15, wherein more than two capacitor pairs are provided, the method comprising the steps of:

During a first sample, selecting a first subset of capacitor pairs from a plurality of capacitor pairs for sampling an input signal in a charge phase and transfer phase and selecting a second subset from the remaining capacitor pairs of said plurality of capacitor pair for sampling a reference signal in a charge phase and transfer phase in parallel with said input signal;

Repeating said steps for following samplings, wherein another first and second subset of capacitor pairs is selected that is different from a previously selected first and second subset.

24. The method according to claim 23, wherein the first subset comprises a plurality of capacitor pairs and the second subset comprises the remaining capacitor pairs from said more than two capacitor pairs.

25. The method according to claim 23, wherein a gain is achieved by a ratio of the number of capacitor pairs assigned to the input signal and the number of pairs assigned to the reference signal.

26. The method according to claim 15, wherein the chopper voltage reference is clocked by a clock controlling said two phases.

* * * * *